(12) United States Patent
Zhang et al.

(10) Patent No.: US 7,397,254 B1
(45) Date of Patent: Jul. 8, 2008

(54) METHODS FOR IMPERFECT INSULATING FILM ELECTRICAL THICKNESS/CAPACITANCE MEASUREMENT

(75) Inventors: Xiafang (Michelle) Zhang, San Jose, CA (US); Zhiwei (Steve) Xu, Sunnyvale, CA (US); Jianou Shi, Milpitas, CA (US); Quoc-Bao Vu, Milpitas, CA (US); Thomas G. Miller, Sunnyvale, CA (US); Gregory S. Horner, Santa Clara, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 86 days.

(21) Appl. No.: 11/277,053

(22) Filed: Mar. 21, 2006

Related U.S. Application Data

(62) Division of application No. 10/754,332, filed on Jan. 9, 2004, now Pat. No. 7,075,318.

(51) Int. Cl.
*G01R 31/302* (2006.01)
(52) U.S. Cl. .................................... 324/750
(58) Field of Classification Search .......... 324/750–765
See application file for complete search history.

(56) References Cited

U.S. PATENT DOCUMENTS

| | | | |
|---|---|---|---|
| 4,599,558 | A | 7/1986 | Castellano et al. |
| 4,812,756 | A | 3/1989 | Curtis et al. |
| 4,827,212 | A * | 5/1989 | Kamieniecki ............. 324/765 |
| 5,196,802 | A | 3/1993 | Burgener et al. |
| 5,485,091 | A | 1/1996 | Verkuil |
| 5,594,247 | A | 1/1997 | Verkuil |
| 5,644,223 | A | 7/1997 | Verkuil |
| 5,648,275 | A | 7/1997 | Smayling et al. |
| 5,650,731 | A | 7/1997 | Fung et al. |
| 5,767,693 | A | 6/1998 | Verkuil |
| 5,834,941 | A | 11/1998 | Verkuil |
| 6,060,709 | A | 5/2000 | Verkuil et al. |
| 6,072,320 | A | 6/2000 | Verkuil |
| 6,091,257 | A | 7/2000 | Verkuil et al. |

(Continued)

FOREIGN PATENT DOCUMENTS

WO 99/59200 11/1999

OTHER PUBLICATIONS

Schroder, "Surface voltage and surface photovoltage: history, theory and applications," Measurement Science and Technology, vol. 12, 2001, pp. R16-R31.

*Primary Examiner*—Ha Nguyen
*Assistant Examiner*—Joshua Benitez
(74) *Attorney, Agent, or Firm*—Baker & McKenzie LLP

(57) ABSTRACT

Methods for determining an electrical parameter of an insulating film are provided. One method includes measuring a surface potential of a leaky insulating film without inducing leakage across the insulating film and determining the electrical parameter from the surface potential. Another method includes applying an electrical field across the insulating film. Leakage across the insulating film caused by the electrical field is negligible. The method also includes measuring a surface potential of the specimen and determining a potential of the substrate. In addition, the method includes determining a pure voltage across the insulating film from the surface potential and the substrate potential. The method further includes determining the electrical parameter from the pure voltage. The electrical parameter may be capacitance or electrical thickness of the insulating film.

19 Claims, 7 Drawing Sheets

U.S. PATENT DOCUMENTS

| | | |
|---|---|---|
| 6,097,196 A | 8/2000 | Verkuil et al. |
| 6,104,206 A | 8/2000 | Verkuil |
| 6,121,783 A | 9/2000 | Horner et al. |
| 6,191,605 B1 | 2/2001 | Miller et al. |
| 6,202,029 B1 | 3/2001 | Verkuil et al. |
| 7,012,438 B1 | 3/2006 | Miller et al. |

* cited by examiner

METHODS FOR IMPERFECT INSULATING FILM ELECTRICAL THICKNESS/CAPACITANCE MEASUREMENT

PRIORITY CLAIM

This application is a divisional application from prior U.S. application Ser. No. 10/754,332 filed Jan. 9, 2004, which claims priority to U.S. Provisional Application No. 60/440,516 filed Jan. 16, 2003.

BACKGROUND OF THE INVENTION

1. Field of the Invention

This invention generally relates to methods for determining one or more electrical parameters of an insulating film. Certain embodiments relate to methods for imperfect insulating film electrical thickness and/or capacitance measurements.

2. Description of the Related Art

Fabricating semiconductor devices such as logic and memory devices typically includes processing a substrate such as a semiconductor wafer using a number of semiconductor fabrication processes to form various features and multiple levels of the semiconductor devices. For example, insulating (or dielectric) films may be formed on multiple levels of a substrate using deposition processes such as chemical vapor deposition ("CVD"), physical vapor deposition ("PVD"), and atomic layer deposition ("ALD"). In addition, insulating films may be formed on multiple levels of a substrate using a thermal growth process. For example, a layer of silicon dioxide may be thermally grown on a substrate by heating the substrate to a temperature of greater than about 700° C. in an oxidizing ambient such as $O_2$ or $H_2O$. Such insulating films may electrically isolate conductive structures of a semiconductor device formed on the substrate.

Measuring and controlling electrical parameters of insulating films such as capacitance is an important aspect of semiconductor device manufacturing. A number of techniques are presently available for measuring capacitance of insulating films.

One example of a technique that can be used to measure the capacitance of insulating films is the mercury probe CV technique. This technique includes using the mercury probe as an electrode and making physical contact between the probe and the top of the insulating film. A voltage is then applied to the insulating film, and the capacitance of the film is measured. Such measurements have the disadvantages of requiring calibration of the surface contact area, variation of the film thickness in the measurement area due to pressure applied on the surface of the film during measurement, and frequent variations in the mercury probe due to mercury oxidation.

Another technique that can be used to measure the capacitance of insulating films is the MOS Cap CV technique. This technique utilizes a metal or a heavily doped polysilicon (poly-Si) electrode to measure capacitance of insulating films by supplying an electric voltage on the electrode. Such measurements have a long history and established utility, however, the weakness of the measurement is the length of time needed to obtain results. For example, it normally takes a few days to make such conductive electrode measurements. Therefore, such a technique is not suitable for in-line capacitance monitoring in many manufacturing situations.

Non-contacting electrical test methodologies have been developed to provide electrical capacitance, electrical thickness, and electrical conductivity measurements. Non-contact electrical measurement techniques have unique advantages in that no modifications to the surface of the insulating film occur during measurement, no contamination is introduced to the fab due to the measurement, the measurements have excellent stability and repeatability, and the measurements can produce results relatively quickly. These techniques, typically, use a charge generation source such as a corona generator and a non-contacting voltage measurement sensor such as a Kelvin probe or a Monroe probe to determine the electrical properties of the films. Examples of such techniques are illustrated in U.S. Pat. Nos. 5,485,091 to Verkuil, 6,097,196 to Verkuil et al., and 6,202,029 to Verkuil et al., which are incorporated by reference as if fully set forth herein.

A non-contacting pure capacitance and electrical thickness test method for imperfect insulators is described in U.S. Patent Application Ser. No. 60/394,835 entitled "Methods and Systems for Determining a Property of an Insulating Film," filed Jul. 10, 2002, which is incorporated by reference as if fully set forth herein. This method includes measuring both capacitance and conduction or leak rate under a given bias to determine the real capacitance and/or electrical thickness of imperfect insulators.

SUMMARY OF THE INVENTION

An embodiment of the invention relates to a method that includes measuring a surface potential of a leaky insulating film without inducing leakage across the insulating film. The method also includes determining an electrical parameter of the insulating film from the surface potential. The electrical parameter may be capacitance or electrical thickness of the insulating film.

An additional embodiment relates to another method for determining an electrical parameter of an insulating film. A specimen may include the insulating film formed on a substrate. The substrate may include p type silicon, n type silicon, epitaxial silicon, a semiconductor material, a conductive material, a silicon on insulator (SOI) substrate, or a film stack. The film stack may include one or more layers that are insulating, conductive, or insulating and conductive.

The method includes applying an electrical field across the insulating film. Leakage across the insulating film caused by the electrical field is negligible. In this manner, the electrical field does not alter the electrical parameter of the insulating film. In some embodiments, the electrical field is about 0.0001 MV/cm to about 1 MV/cm. In other embodiments, the electrical field is less than about 0.2 MV/cm. In yet another embodiment, the electrical field is about 0 MV/cm.

The method also includes measuring a surface potential of the specimen. In one embodiment, applying the electrical field across the insulating film and measuring the surface potential are performed without contacting a surface of the specimen. In another embodiment, applying the electrical field across the insulating film and measuring the surface potential include contacting the surface of the specimen. In addition, measuring the surface potential may be performed in the presence of a background light.

In addition, the method includes determining a potential of the substrate. In one embodiment, the potential of the substrate is determined experimentally. In another embodiment, the potential of the substrate is determined theoretically.

The method further includes determining a pure voltage across the insulating film from the surface potential and the substrate potential. Furthermore, the method includes determining the electrical parameter of the insulating film from the pure voltage. The electrical parameter may be capacitance or electrical thickness of the insulating film. In some embodiments, the method may include determining an optical or physical thickness of the insulating film and determining a dielectric constant of the insulating film from the capacitance and the optical or physical thickness. In other embodiments, the method may include obtaining an optical thickness from a host computer and determining a dielectric constant of the insulating film from the capacitance and the optical thickness. Such embodiments may also include reporting the dielectric constant to the host computer.

In one embodiment, the method may include altering a parameter of a process tool in response to the electrical parameter using a feedback control technique or a feedforward control technique. In another embodiment, the method may be performed during a semiconductor fabrication process. In one such embodiment, the method may include altering a parameter of a process tool in response to the electrical parameter using an in situ control technique.

A further embodiment relates to another method for determining an electrical parameter of an insulating film. A specimen may include the insulating film formed on a substrate. This method may include applying an electrical field across the insulating film. Leakage across the insulating film caused by the electrical field is negligible. The insulating film has a thickness such that a potential of the substrate is negligible. In one embodiment, the thickness of the insulating film is greater than about 400 Å. In another embodiment, the thickness of the insulating film is greater than about 1800 Å. The method also includes measuring a surface voltage of the specimen. Measuring the surface voltage of the specimen may be performed in accumulation, depletion, inversion, or a combination thereof. In addition, the method includes determining the electrical parameter of the insulating film from the surface voltage.

BRIEF DESCRIPTION OF THE DRAWINGS

Other objects and advantages of the invention will become apparent upon reading the following detailed description and upon reference to the accompanying drawings in which.

Figure 1:
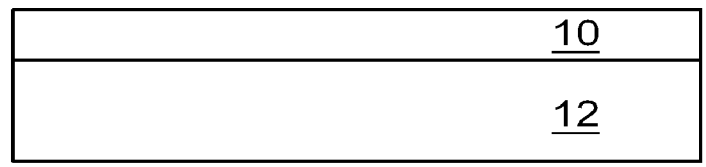
FIG. 1 is a partial cross-sectional view of an embodiment of an insulating film formed on a substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

In all description provided herein, the term "surface voltage" is used interchangeably with the term "surface potential."

The following description generally relates to methods and systems for measuring pure capacitance and/or electrical thickness of insulating films that are not perfect insulators. The insulating films may have any thickness. In a common implementation, the films in question may be produced in processes of semiconductor device manufacturing. In some embodiments, the insulating film to be measured is on the top surface of a substrate such as a silicon wafer. In particular, the following description relates to systems and methods for measuring such insulating films in a non-contact manner, and in the presence of significant imperfect insulation. By using the methods and systems described herein, the effects of leakage through such insulating films can be eliminated and used to determine various properties of insulating films more accurately. Compared to the approaches described above in the "Description of the Related Art," these techniques are advantageous by combining high sensitivity, high throughput, high measurement stability, and high repeatability.

Present technology for manufacturing integrated circuits and semiconductor devices makes extensive use of the formation of insulating films. These films may also be commonly referred to as "dielectric layers." In a typical implementation, such an insulating film may include silicon dioxide ("$SiO_2$"), silicon nitride ("$Si_3N_4$"), a nitrided form of amorphous $SiO_2$, which may be commonly referred to as oxynitride ("$SiO_xN_y$"), silicon carbon, fluorine-doped oxide, spin-on glasses, organic polymers, and other insulating films. Many other materials are also commonly used. Such films, typically, have high insulating quality. However, some films may be very leaky due to high film defect density or simply because the film is too thin. For example, relatively thin films (i.e., films having a thickness of less than about 8 nm) may depart substantially from ideal insulating behavior. That is, such films may allow significant amounts of current to flow through the insulating film.

For insulating films such as $SiO_2$, significant departure from a perfect insulator can occur even for thick films. For example, significant departures from a perfect insulator may occur at thicknesses of greater than about 30 nm, or even greater than about 50 nm. Such leaky films may include materials commonly known as "low-k" or "high-k" insulating films, where "k" refers to the real part of the dielectric constant as measured at electrical frequencies. A low-k insulating film may include any material having a dielectric constant lower than about 3.9. Such low-k insulating films are generally used when reduced film capacitance per unit area is desired. Examples of commercially available low-k dielectric materials include, but are not limited to, proprietary materials known as Silc™, Black Diamond™, CORAL™, and Flare™. A high-k insulating film may include any material having a dielectric constant of greater than about 3.9. A high-k insulating film is often used when increased film capacitance per unit area is required for device operation. Examples of high-k materials include, but are not limited to, tantalum pentoxide ("$Ta_2O_5$"), hafnium dioxide ("$HfO_2$"), aluminum trioxide ("$Al_2O_3$"), and zirconium dioxide ("$ZrO_2$"). It is to be understood that the methodology described herein is not specific to any composition or thickness of insulating film.

Such insulating films may be formed, for example, by deposition or thermal growth on a conductive or semiconductor substrate. The substrate may include, but is not limited to, silicon, epitaxial silicon, silicon-on-insulator ("SOI"), or another semiconductor or conductive material such as gallium arsenide or indium phosphide. The substrate may be a P-type silicon substrate or an N-type silicon substrate. The substrate may also include any substrate commonly found and/or processed in semiconductor fabrication facilities, which may be commonly referred to as a "wafer." In some cases, the substrate may include a film stack that includes one or more layers that are insulating, conductive, or insulating and conductive. For example, the insulating film of interest may be the top layer of a stack of insulators, insulators and conductors, or conductors. In other embodiments, the insulating films may be a single layer or multiple layers deposited or grown on a conductive or semiconductor substrate. The insulating film may have a thickness ranging from about $1 \times 10^{-4}$ μm to about 100 μm. The thickness of the insulating film may vary, however, depending on parameters of the insulating film and the selected capacitance per unit area. As used herein, a "specimen" includes an insulating film formed on a substrate.

Figure 2:
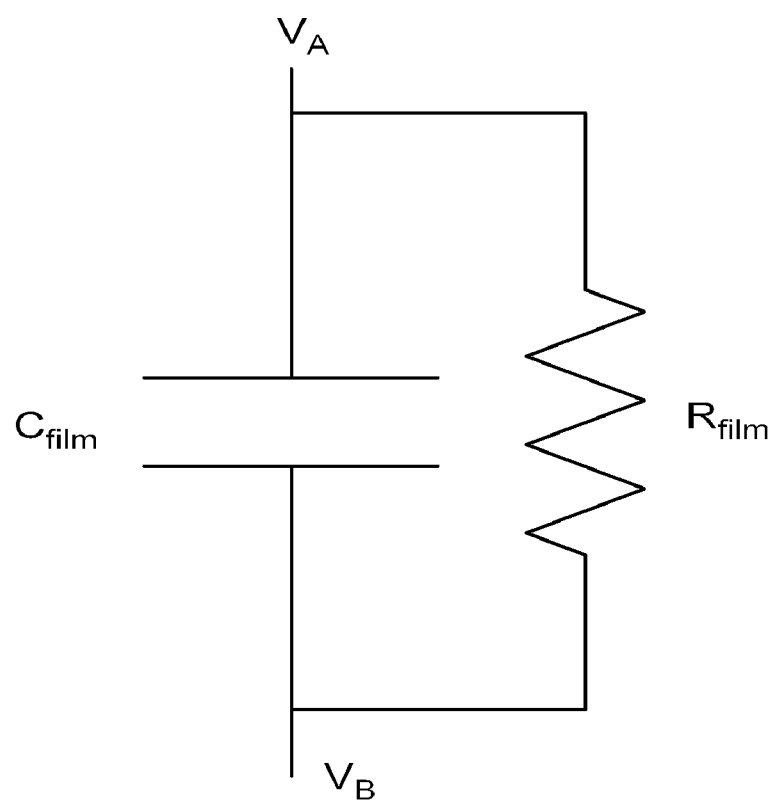
FIG. 2 is a schematic diagram of the insulating film formed on the substrate.

For simplicity of illustration, FIG. 1 illustrates a single layer of insulating film 10 formed on substrate 12. The insulating film may be schematically illustrated as shown in FIG. 2, in which a resistance of the film, $R_{film}$, is electrically in parallel with a capacitance of the film, $C_{film}$. $R_{film}$ corresponds to the resistance of this film to current transport vertically through the film within a given test area, A. $R_{film}$ may vary with voltage as $R_{film}$=function $(V_{film})$. $C_{film}$ corresponds to the capacitance of the region of the insulating film under test. $R_{film}$ may be related to the film resistivity, $\rho_{film}$, by the following equation:

$$R_{film} = \rho_{film} * T_{film}/A, \qquad (1)$$

where $T_{film}$ is the physical thickness of the film, and A is the cross-sectional area of the region of the insulating film being tested. As shown in FIG. 2, $V_A$ corresponds to the voltage potential at the top of the film, and $V_B$ corresponds to the voltage of the substrate underneath the film. $V_B$ will be considered to be at ground potential for the purpose of the immediate discussion.

In the absence of leakage, the voltage between points A and B, $V_{AB}$, may be defined by the equation for a parallel plate capacitor:

$$Q = V_{AB} * C_{film}, \qquad (2)$$

where Q represents charge on the surface of the insulating film. By making depositions of charge, the total of which is recorded as $Q_i$ using a non-contacting technique and measuring subsequent voltage measurements of the potential, $V_{AB}$, recorded as $V_i$ using a non-contacting technique, the capacitance of the film, $C_{film}$, may be determined.

Traditionally, capacitance or electrical thickness measurements of an insulating film on a semiconductor substrate are performed in the accumulation or inversion regions. By making measurements in accumulation or inversion, the functional dependency of the substrate potential becomes less important in the theoretical analysis. In a typical non-contact measurement system, the capacitance and electrical thickness are determined from the slope of deposited charge versus voltage across the insulating film as described below in the accumulation or inversion region.

For example, in many implementations, the initial charge of the surface is unknown, and equation 2 may be rewritten as:

$$Q_i = V_i * C_{film} + X_1, \qquad (3)$$

where $X_1$ is an offset related to the initial charge on the surface of an insulating film and within the insulating film, but which is unimportant to this discussion. $C_{film}$ may be determined using a least-squares fit of any portion of $Q_i$-$V_i$ data with a slope being equal to $C_{film}$ according to equation 3. In a technologically feasible implementation, the voltages, $V_i$, corresponding to charge states, $Q_i$, may be measured at different times denoted as $t=t_i$.

Very often, however, insulating films having large film leakage have high interface trap densities. As a result, a high bias is required to reach the accumulation or inversion region. Leakage is also a function of applied electrical field. For example, increasing the applied bias increases the leakage rate. Therefore, current transporting through leaky films during measurement can be significant. As a result, increasing the applied bias increases the inaccuracy of the measurement results. Therefore, standard capacitance and electrical thickness measurements are not suitable for imperfect insulating films. For example, without taking current transportation into account during the measurements, most electrical techniques for measuring insulating film capacitance or electrical thickness in the presence of such leakage result in smaller electrical thickness measurements and larger capacitance measurements.

Since leakage is a function of the electrical field, by carefully reducing the applied electrical field, the impact due to leakage can be reduced to negligible levels. In this manner, a surface potential of a leaky insulating film may be measured without inducing leakage across the insulating film. In addition, an electrical parameter of the insulating film may be determined from the surface potential. As a result, electrical thickness or capacitance can be measured accurately.

Measuring an electrical parameter of a leaky insulating film may include applying a relatively small electrical field on an insulating film such that leakage across the insulating film induced by the electrical field can be reduced to negligible levels. However, in some cases, the functional dependency of the substrate potential may become significant. In the methods described herein, a new technique and method are used to solve the substrate potential impact on the leaky films with a small applied electrical field.

One embodiment of a method for non-contact capacitance and/or electrical thickness measurements for an imperfect insulating film includes the following steps. A specimen, which includes an insulating film formed on a substrate, is biased using a very small amount of charge deposited by a corona charge deposition system, an e-beam charge deposition system, an ion beam charge deposition system, or a plasma-based charge deposition system. The corona charge deposition system may include one or more sources such as wire sources, "blanket" sources, or one of the sources described below. In this manner, applying an electrical field across the insulating film may be performed without contacting a surface of the specimen.

The amount of charge deposited on the insulating film is small enough such that the leakage current in the insulating film caused by the applied electrical field is reduced to negligible levels. In this manner, the amount of charge deposited on the insulating film is also small enough such that the applied electrical field does not alter the electrical parameters of the insulating film. In one embodiment, the electrical field applied to the insulating film ranges from about 0.0001

MV/cm to about 1 MV/cm. In some embodiments, the electrical field applied to the insulating film may be less than about 0.2 MV/cm. In one such embodiment, the electrical field applied to the insulating film may be about 0 MV/cm. The applied electrical field can be used at a frequency from about 0 MHz to about 1 MHz.

In one embodiment, the surface potential of the specimen may be measured using a work function sensor. The work function sensor may be a Kelvin probe, a Monroe probe, an electrostatic force probe, or an atomic force microscopy (AFM) type probe. As such, the surface potential may be measured without contacting a surface of the specimen. The data acquired using a charge deposition system and a work function sensor is Q-V data. The surface voltage data can be obtained in a point format or a map format by using substantially uniform blankets of charge and mapping $V_{surf1}$ and $V_{surf2}$. Voltage data may be acquired in accumulation (i.e., negative voltages on a p-type wafer or positive voltages on an n-type wafer), depletion, inversion (i.e., positive voltages on a p-type wafer or negative voltages on an n-type wafer), or a combination of two or three of them.

In other embodiments, the electrical field may be applied to the insulating film and the surface potential may be measured using a contact technique such as a mercury probe CV technique or a MOS Cap CV technique. These techniques involve applying a voltage to the insulating film with a probe or an electrode to generate a relatively small electrical field across the insulating film and measuring the capacitance of the insulating film while the probe or the electrode is in contact with a surface of the specimen. Therefore, a C-V plotter can be used to acquire C-V data.

The method also includes determining a potential of the substrate. In one embodiment, the substrate potential is measured experimentally using a surface photo voltage measurement technique or any other measurement technique known in the art. The surface photo voltage measurement technique involves measuring the surface voltage in the presence of a background light. For example, measuring the substrate potential may include illuminating the surface of the specimen with a light source such as a laser, a multi-wavelength lamp source, or any other appropriate light source known in the art, and measuring the surface voltage. In an alternative embodiment, the substrate potential may be determined theoretically using a theoretical model or an empirical model known in the art.

In this manner, the "pure" voltage across the insulating film can be determined as the difference between the surface potential and the substrate potential. Consequently, one or more electrical parameters of the insulating film can be calculated from the pure voltage. Some of the electrical parameters that can be obtained using this technique include capacitance ($C_{Die}$), equivalent oxide thickness (EOT), electrical film thickness ($T_{film}$), and dielectric constant ($\kappa$). The pure voltage across the insulating film may also be determined at one or more sites on the specimen by performing the above measurements at a specific site on the specimen or at different sites on the specimen. Therefore, one or more electrical parameters of the insulating film can be determined for one or more sites on the specimen. Furthermore, a two-dimensional map of the electrical parameters across specimen may be generated or displayed.

The real capacitance ($C_{Die}$) can be determined from the pure voltage across the insulating film and the deposited charges. For example, when a small electrical field is applied on a leaky insulating film, $C_{Die}$ can be given by the following equation in accumulation, depletion, and inversion:

$$C_{Die} = \frac{(\Delta V_{Die} - \Delta V_{Si})}{\Delta Q}. \tag{4}$$

$\Delta V_{Die}$ can be measured using a work function sensor, and $\Delta V_{Si}$ can be measured either by a surface photo voltage method or by modeling using a theoretical model or an empirical model.

The equivalent oxide thickness can be determined using the dielectric constant of silicon oxide and the measured capacitance. In a similar manner, the electrical film thickness can be determined using the dielectric constant of the insulating film and the measured capacitance. For example, if the dielectric constant of the film is known or is assumed, an "electrical film thickness," $T_{film}$, may be determined from the capacitance. The capacitance of the film may be related to the electrical thickness using the equation:

$$T_{film} = \epsilon_0 * \kappa * A / C_{film}, \tag{5}$$

wherein $\epsilon_0$ is the free space permittivity of vacuum, and $\kappa$ is the film relative dielectric constant. In this manner, the expression relating film capacitance, electrical thickness, and dielectric constant is that of a parallel plate capacitor.

If the dielectric constant of the insulating film is not known, the dielectric constant can be determined using the physical thickness of the insulating film and either the measured capacitance or the calculated EOT using one of the following equations:

$$\kappa = \frac{C_{Die} * T_{Physical}}{\varepsilon_0}, \text{ or} \tag{6}$$

$$\kappa = \frac{3.9 * EOT}{T_{Physical}}. \tag{7}$$

The physical thickness of the film may be estimated from process conditions that were used to form the insulating film or may be measured independently using an experimental method. Methods for determining the physical thickness of the film independently may include, but are not limited to, x-ray photoelectron spectroscopy (XPS), transmission electron microscopy (TEM), step profilometry, and any other techniques or systems known in the art. Alternatively, the dielectric constant may be determined from the capacitance and an optical thickness of the insulating film. Methods for determining the optical thickness of the film independently may include, but are not limited to, ellipsometry, reflectometry, and any other techniques known in the art.

In addition, the optical thickness can be obtained from a host computer. The host computer may or may not be coupled to a measurement system used to perform the measurements described above. For example, the host computer may be coupled to such a measurement system by a transmission medium that may include "wired" and "wireless" portions. The optical thickness obtained from the host computer may have been sent to the host computer from a different measurement system such as an ellipsometer or reflectometer also coupled to the host computer.

The dielectric constant of the insulating film may be determined from the capacitance and the optical thickness obtained from the host computer. The dielectric constant may be reported back to the host computer. In some embodiments, the host computer may be located in a semiconductor fabrication facility (a "fab"). The host computer may have access to a fab database through a network or a storage medium coupled to the host computer. The fab database may include a variety of information related to tools and processes carried out in the fab such as tool history, wafer history, and reticle history. A fab database may also include any set of data suitable for use in an overall fab management system. An example of such a system is illustrated in PCT Publication No. WO 99/59200 to Lamey et al., which is incorporated by reference as if fully set forth herein. The host computer may update the fab database with the determined dielectric constant. The information stored in the fab database may be used for statistical process control (SPC) or other functions.

In this manner, a dielectric constant of an insulating film may be determined from a physical or optical thickness and a capacitance that are independently determined. An independent determination of $\kappa$ may be a technologically important aspect for characterizing many dielectric materials.

Figure 3:
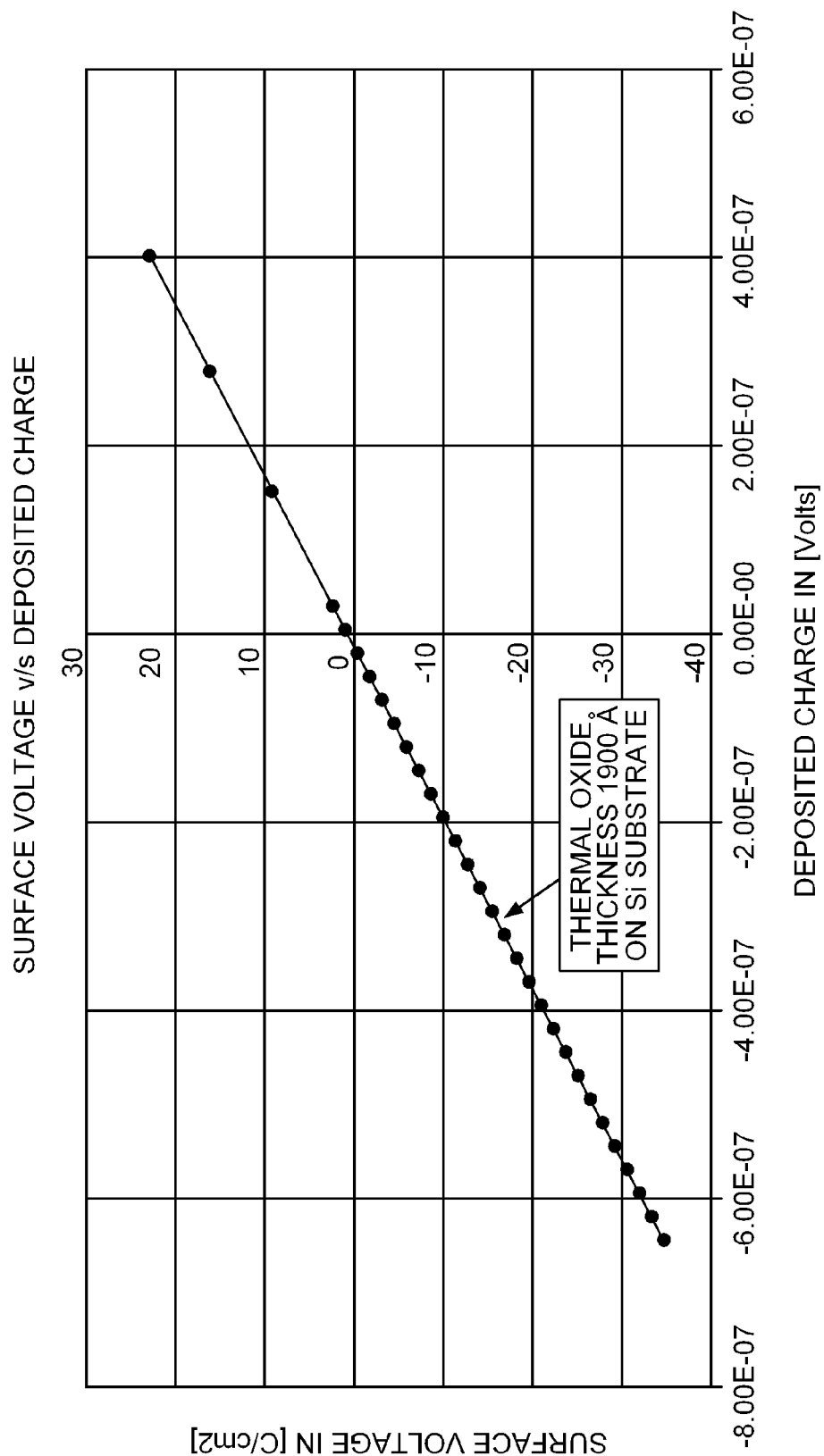
FIG. 3 is an exemplary graph of surface voltage versus deposited corona charge for an insulating film of thermal oxide having a thickness of 1900 Å.

However, it is noted that when the insulating film is relatively thick, the substrate potential impact on the measurement results can be negligible even in the depletion region. For example, the impact of the substrate potential on the measurements can be negligible for insulating films having a thickness greater than about 400 Å. This thickness may vary, however, depending on the composition of the insulating film, other characteristics of the insulating film, and other materials present on the substrate. For example, in some cases, the impact of the substrate potential on the measurements can be negligible for insulating films having a thickness greater than about 1800 Å. FIG. 3 illustrates a graph of surface voltage versus deposited corona charge (i.e., a Q-V sweep) for an insulating film of thermal oxide having a thickness of 1900 Å formed on a silicon substrate. The slope of deposited charge versus surface voltage is constant in accumulation, depletion, and inversion. In this case, regardless of the initial state, an extremely small amount of charge can be applied to the insulating film, and the change in surface voltage can be measured and used to determine the capacitance and electrical thickness of the insulating film.

Figure 4:
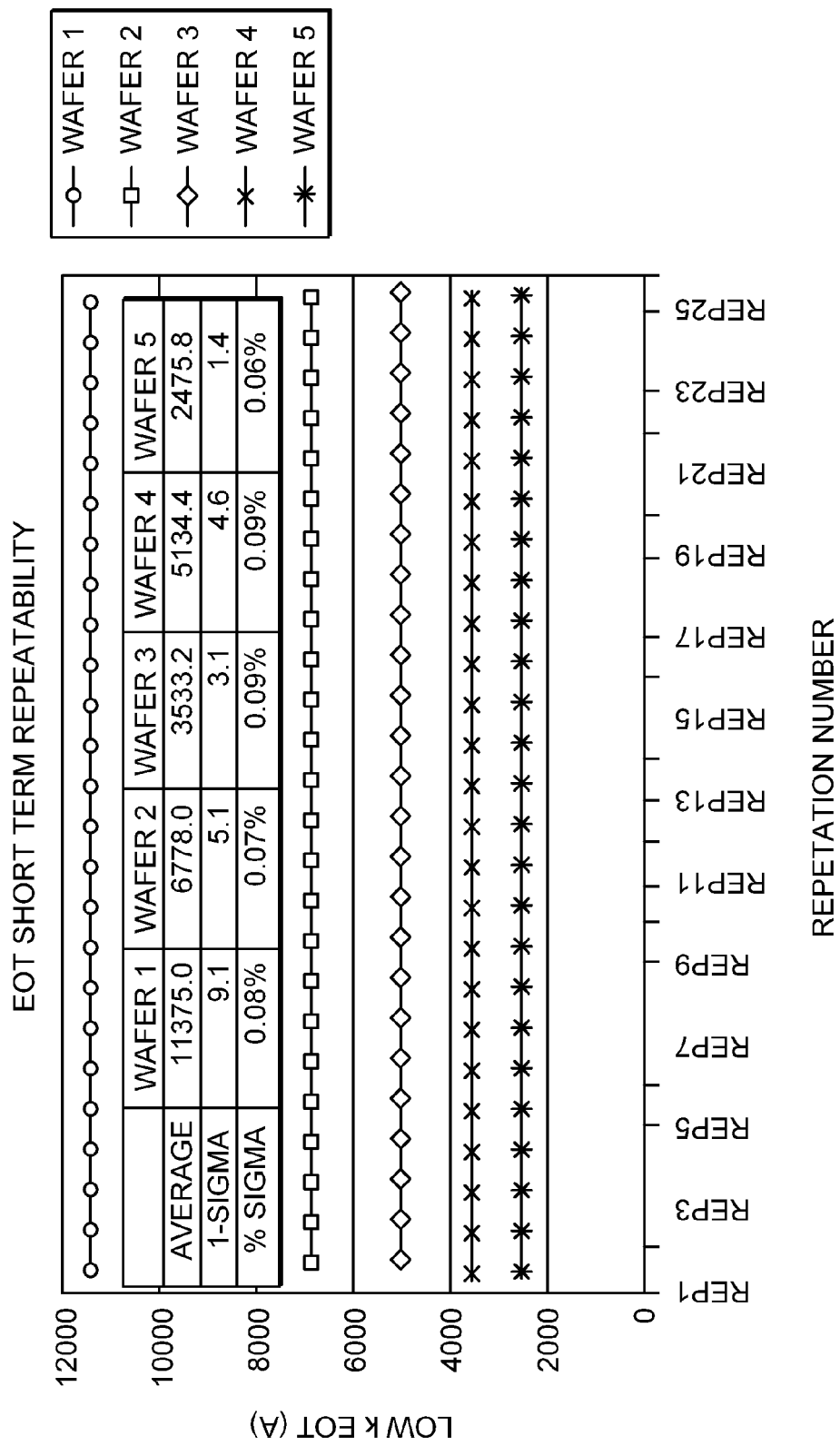
FIG. 4 is an exemplary graph of the short term repeatability of measurements on a low k insulating film.
Figure 5:
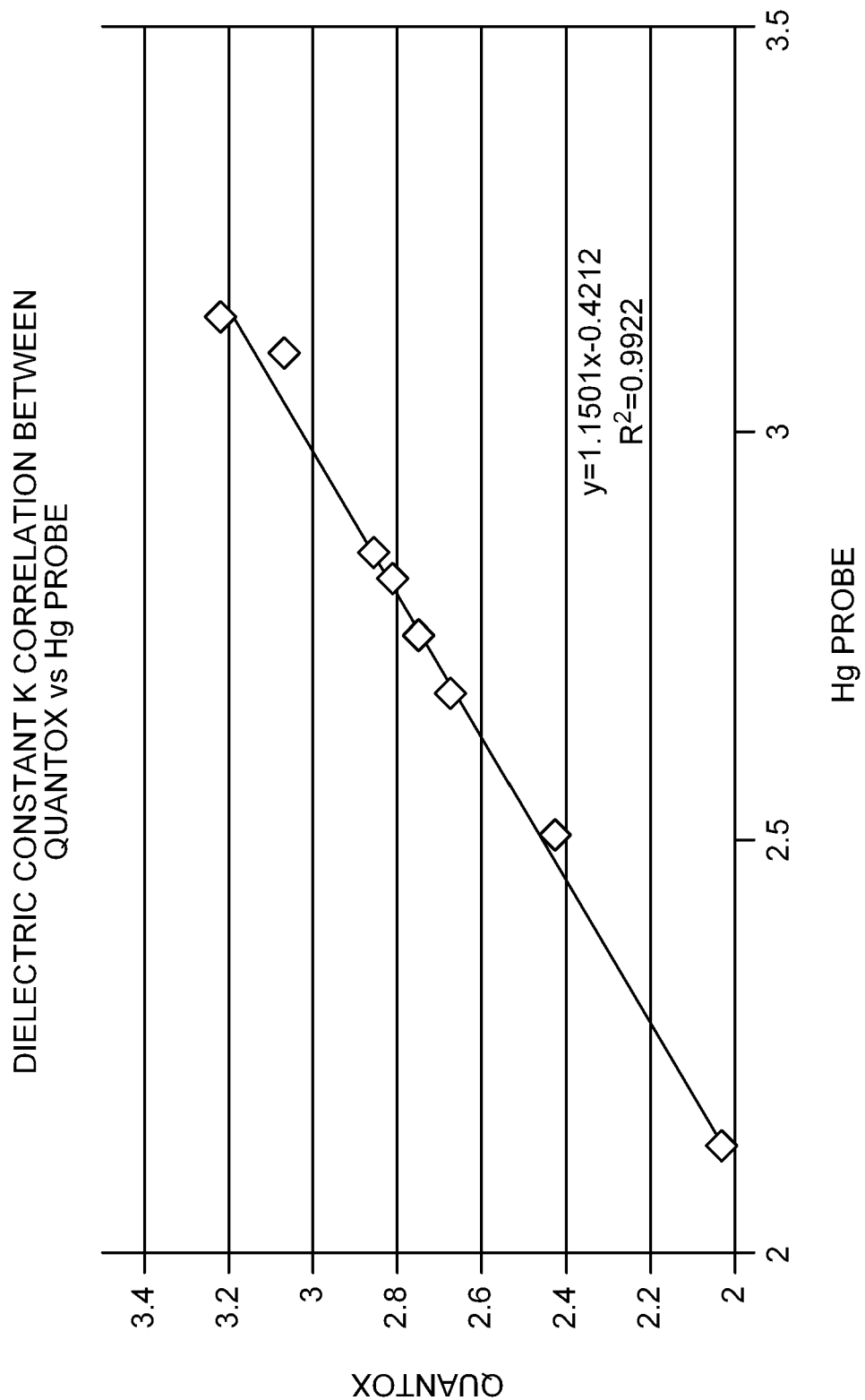
FIG. 5 is an exemplary graph of the dielectric constant correlation between measurements made using the techniques described herein and measurements made using the mercury probe CV technique.

Therefore, by making measurements in this non-traditional voltage or electrical field regime, the effects of leakage may be reduced, and even completely eliminated, and superior performance can be achieved. In addition, the methods described herein have short term repeatability. For example, FIG. 4 illustrates the short-term stability of the EOT for different low-k insulating film having different thicknesses determined using the methods described herein. Furthermore, the methods described herein produce results that can be correlated to measurements performed with other techniques. For example, FIG. 5 illustrates a correlation between dielectric constants determined using the techniques described herein (as shown on the y-axis) and dielectric constants determined using the mercury probe CV technique. Additionally, the capacitance and electrical thickness of insulating films can be determined accurately and rapidly using the methods described herein. Another advantage of the techniques and methods described herein is the simplicity of the methods and the ease-of-use. For example, it is possible to develop a single methodology to cover all types of insulating films.

In another embodiment, the method may include altering a parameter of a process tool in response to one or more electrical parameters of the insulating film using a feedback control technique. In a further embodiment, the method may include altering a parameter of a process tool in response to one or more electrical parameters of the insulating film using a feedforward control technique. In yet another embodiment, the method may be performed during a semiconductor fabrication process or another process. Therefore, the method may include altering a parameter of a process tool in response to one or more electrical parameters of the insulating film using an in situ control technique, or a "real-time control loop." The process tool may include any process tool known in the art of semiconductor manufacturing such as a deposition tool. In one embodiment, the method may include altering a parameter of a process tool in response to a dielectric constant of an insulating film, which can be determined as described herein. The parameter of the process tool may be altered using a feedback control technique, a feedforward control technique, and/or an in situ control technique.

Figure 6:
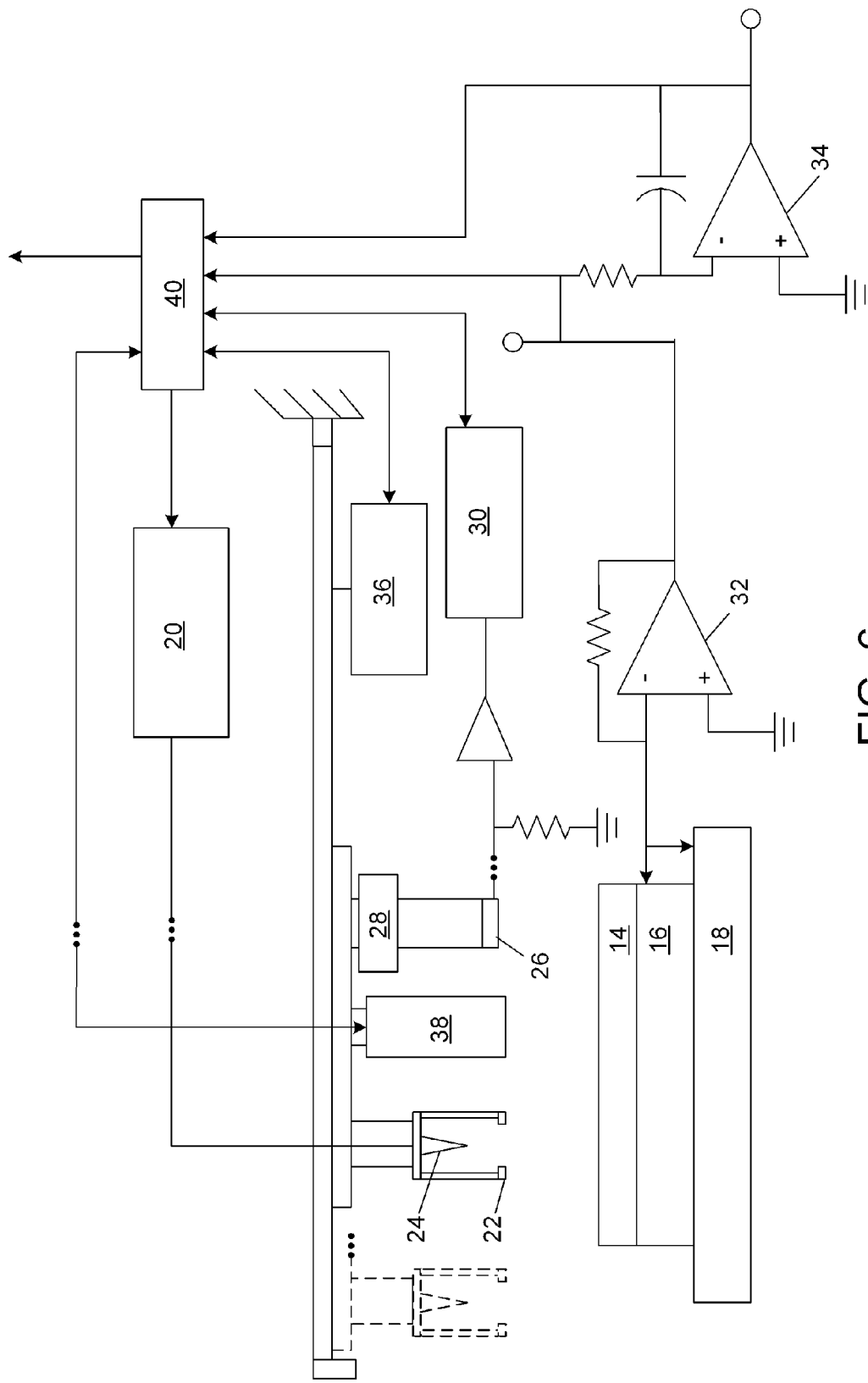
FIG. 6 is a schematic diagram of a side view of an embodiment of a system configured to measure electrical parameters of an insulating film using non-contacting techniques.

An example of a system that may be used to perform the techniques and methods described herein is illustrated in FIG. 6. The system may be configured to measure current-voltage characteristics of insulating film 14 formed on substrate 16. The system may include wafer chuck 18 configured to hold substrate 16 during a measurement process. Wafer chuck 18 may also provide a grounding contact to substrate 16. The grounding contact may be obtained, for example, from a high pressure contact using a sharp tungsten carbide needle. The system may also include high voltage supply 20 coupled to corona gun 22. High voltage supply 20 may be configured to supply high voltage (i.e., about 6 kV to about 12 kV) to the corona gun to produce positive or negative corona charges depending on the polarity of supply 20. Corona gun 22 may include one or more needles 24 coupled to high voltage supply 20.

In addition, the system may include Kelvin probe 26. Kelvin probe 26 may include an electrode coupled to vibrator 28. Movement of probe 26 above a charged surface may result in an AC voltage representative of the potential of the charged surface. Kelvin controller 30 may be configured to convert an AC voltage to a signal corresponding to the voltage of the surface.

Current flowing through insulating film 14 and substrate 16 from corona gun 22 may be converted to a voltage by current-to-voltage converter 32. This voltage (current) may be integrated by charge integrator 34 to provide a measure of the charge deposited by corona gun 22 on insulating film 14. The circuits, thus, are configured as a coulombmeter. The system may also include position actuator 36. Position actuator 36 may be configured to move corona gun 22 and Kelvin probe 26 over substrate 16, as shown in phantom in FIG. 6. The system may also include surface photo voltage (SPV) device 38. SPV device 38 may be configured to make an SPV measurement using a relatively high intensity light source such as a xenon flash tube.

The system may further include controller 40 configured to control operation of the system. Controller 40 may be configured to control position actuator 36 and high voltage supply 20 in response to Kelvin controller 30, current-to-voltage converter 32, and charge integrator 34. The controller may also be configured to provide a measurement of the current-voltage behavior of insulating film 14 and substrate 16. The controller may be, for example, a dedicated microprocessor-based controller or a general purpose computer.

Figure 7:
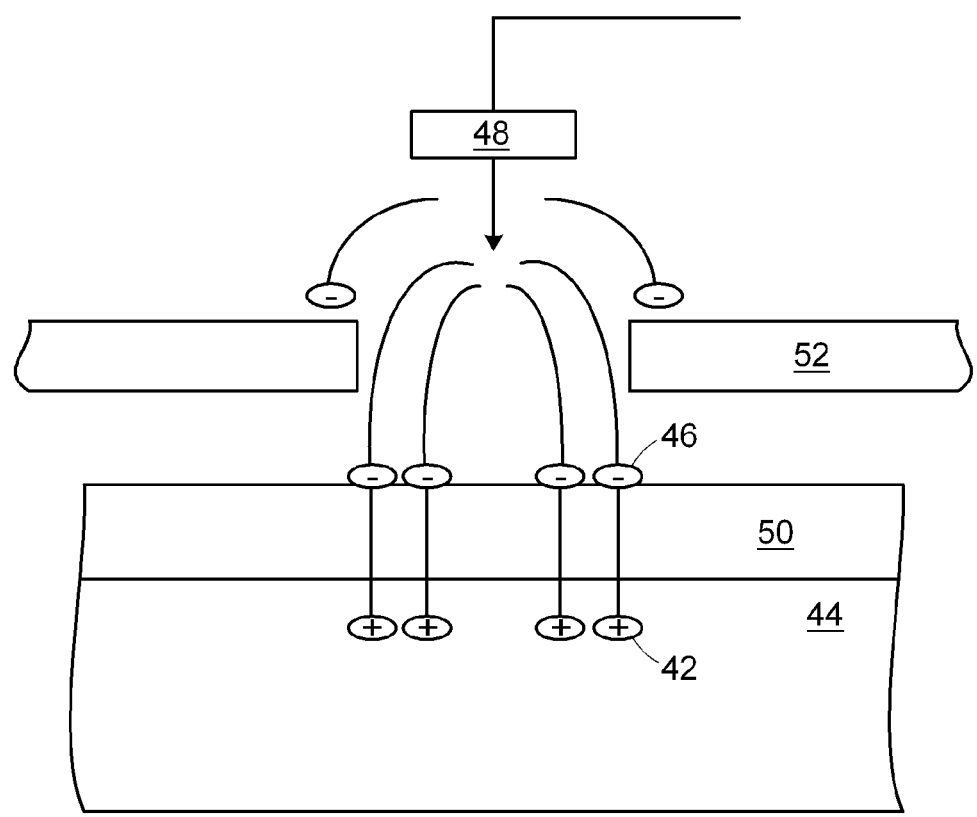
FIG. 7 is a schematic diagram of a side view of an embodiment of a charge deposition on a surface of an insulating film using a corona source.

FIG. 7 illustrates an embodiment of a charge deposition on a surface of an insulating film using a corona source. As shown in FIG. 7, positive charge accumulation 42 in p-type silicon substrate 44 may result from the deposition of negative charges 46 from negative corona source 48 onto surface of oxide layer 50 overlying substrate 44. The corona discharge may be applied to the area of interest via mask 52. In one embodiment, it may be necessary for purposes of obtaining accurate thickness measurements, that a uniform density of charge 46 be deposited through the aperture in mask 52.

Figure 8:
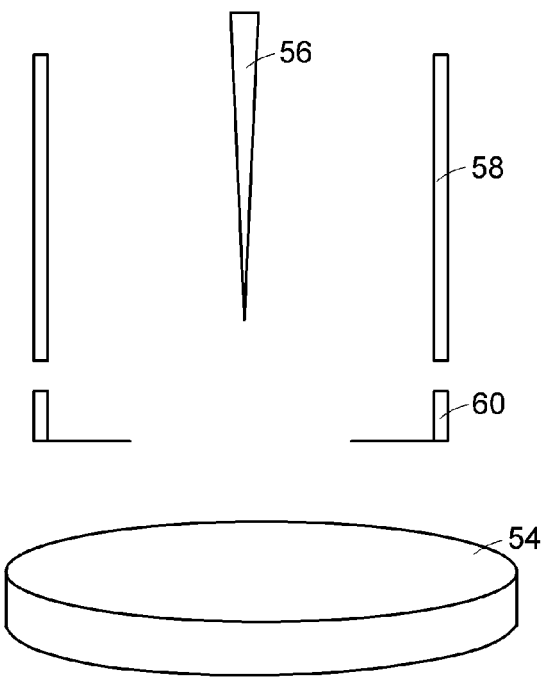
FIGS. 8 and 9 are schematic diagrams of partial cross-sectional views of alternative embodiments of a corona source.
Figure 9:
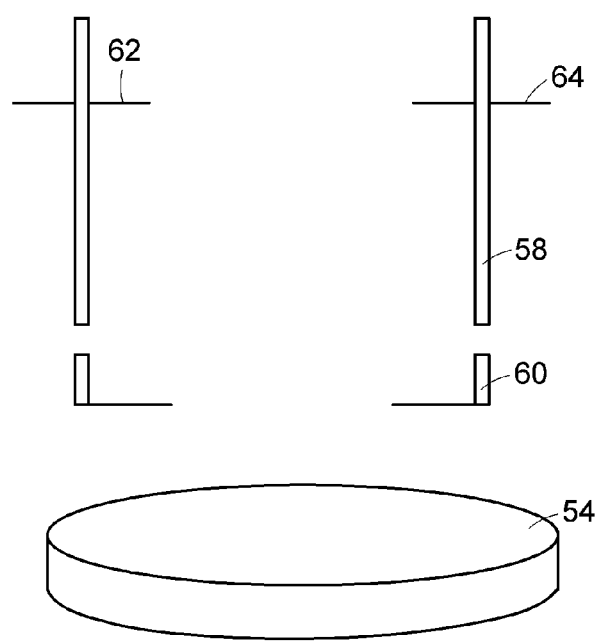

FIGS. 8 and 9 illustrate partial cross-sectional views of alternative embodiments of a corona source, which may be used to deposit a charge substantially uniformly over an area of specimen 54. Specimen 54 may include an insulating film and a substrate as described herein. The corona sources may be configured to provide a well-defined and substantial beam charge density (to minimize measurement time) having relative uniformity (for measurement accuracy) across the selected site of interest on specimen 54. As shown in FIG. 8, the corona source may include needle 56 and beam shaping electrodes 58 and 60. Beam shaping electrodes 58 and 60 may be arranged concentric with an axis of needle 56. Beam shaping electrodes 58 and 60 and the biasing voltages applied thereto may improve the corona charging capability of the gun in two important ways. First, lower electrode 60 may act as a mask for defining the diameter of the area of corona deposition. Second, the bias voltage on electrode 60 (same polarity as the corona ions) repels ions that normally would be captured by the edge of electrode 60 and directs them down to the specimen site with an enhanced density that abruptly ceases under the edge of electrode 60.

Upper electrode 58 may help to boost the efficiency of the corona source by being biased at a relatively high voltage (up to ±3 kV) with the same polarity as the corona ions. Potentials in the range of ±6-9 kV and up to ±1.5 kV are appropriate for needle 56 and mask electrode 60, respectively. This may result in an electrical field configuration, in the upper region of the corona source, that prevents many of the ions from being captured by the upper electrode and directs them down to lower electrode 60 which, in turn, directs them to the specimen site. It should be noted that needle 56 and electrodes 58 and 60 may be supported and insulated from each other by suitable insulated support members (not shown) that may allow for the application of the necessary biases.

FIG. 9 is essentially the same as FIG. 8 except for the important difference that two facing and horizontal needles 62 and 64 are provided in FIG. 9 in lieu of the single vertical needle 56 of FIG. 8. The potential applied to needles 62 and 64 and electrodes 58 and 60 of FIG. 9 may be the same as the corresponding parts in the case of FIG. 8.

Additional examples of non-contact corona sources are illustrated in U.S. Pat. Nos. 4,599,558 to Castellano et al., 5,594,247 to Verkuil et al., and 5,644,223 to Verkuil and are incorporated by reference as if fully set forth herein. In an embodiment, a system as described herein, may include a non-contact work function sensor such as a Monroe probe in place of a Kelvin probe. Further examples of work function sensors that may be incorporated into the system are illustrated in U.S. Pat. Nos. 4,812,756 to Curtis et al., 5,650,731 to Fung, and 5,767,693 to Verkuil, which are incorporated by reference as if fully set forth herein. In addition, any other appropriate system and corona source known in the art may be used for carrying out a method as described herein.

The measurement system may be configured as described above. An additional example of an appropriate measurement system is the Quantox or Quantox XP system, which is commercially available from KLA-Tencor. Further examples of appropriate measurement systems are illustrated in one or more of U.S. Pat. Nos. 5,594,247 to Verkuil et al., 5,767,693 to Verkuil, 5,834,941 to Verkuil, 6,060,709 to Verkuil et al., 6,072,320 to Verkuil, 6,091,257 to Verkuil et al., 6,097,196 to Verkuil et al., 6,104,206 to Verkuil, 6,121,783 to Horner et al., 6,191,605 to Miller et al., and 6,202,029 to Verkuil et al., which are incorporated by reference as if fully set forth herein. The measurement system may be configured as illustrated in any of these U.S. patents. Program instructions implementing methods such as those described above may be transmitted over or stored on a carrier medium. The carrier medium may be a transmission medium such as a wire, cable, or wireless transmission link, or a signal traveling along such a wire, cable, or link. The carrier medium may also be a storage medium such as a read-only memory, a random access memory, a magnetic or optical disk, or a magnetic tape.

In an embodiment, the computer system may be configured to execute the program instructions to perform a computer-implemented method according to the above embodiments. The computer system may take various forms, including a personal computer system, mainframe computer system, workstation, network appliance, Internet appliance, personal digital assistant ("PDA"), television system or other device. In general, the term "computer system" may be broadly defined to encompass any device having a processor, which executes instructions from a memory medium.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

It will be appreciated to those skilled in the art having the benefit of this disclosure that this invention is believed to provide methods and systems for measurements of insulating film electrical thickness and/or capacitance. Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method, comprising measuring a surface potential of a leaky insulating film without inducing leakage across the insulating film and determining an electrical parameter of the insulating film from the surface potential, wherein said determining comprises determining a potential of a substrate on which the insulating film is formed, determining a pure voltage across the insulating film from the surface potential and the substrate potential, and determining the electrical parameter of the insulating film from the pure voltage.

2. The method of claim 1, wherein the electrical parameter comprises capacitance or electrical thickness.

3. The method of claim 1, further comprising applying an electrical field across the insulating film prior to said measuring, wherein leakage across the insulating film caused by the electrical field is negligible.

4. The method of claim 1, wherein the electrical parameter comprises capacitance, the method further comprising obtaining an optical thickness from a host computer, determining a dielectric constant of the insulating film from the capacitance and the optical thickness, and reporting the dielectric constant to the host computer.

5. The method of claim 1, wherein the electrical parameter comprises capacitance, the method further comprising determining an optical or physical thickness of the insulating film and determining a dielectric constant of the insulating film from the capacitance and the optical or physical thickness.

6. The method of claim 5, further comprising altering a parameter of a process tool in response to the dielectric constant using a feedback control technique, a feedforward control technique, or an in situ control technique.

7. The method of claim 1, further comprising applying an electrical field across the insulating film prior to said measuring, wherein the electrical field is about 0.0001 MV/cm to about 1 MV/cm.

8. The method of claim 1, further comprising applying an electrical field across the insulating film prior to said measuring, wherein the electrical field does not alter the electrical parameter of the insulating film.

9. The method of claim 1, wherein said determining further comprises experimentally determining the potential of the substrate.

10. The method of claim 1, wherein said determining further comprises theoretically determining the potential of the substrate.

11. The method of claim 1, wherein said measuring is performed without contacting a surface of the insulating film.

12. The method of claim 1, wherein said measuring comprises contacting a surface of the insulating film.

13. The method of claim 1, wherein said measuring is performed in the presence of a background light.

14. The method of claim 1, further comprising altering a parameter of a process tool in response to the electrical parameter using a feedback control technique or a feedforward control technique.

15. The method of claim 1, wherein the method is performed during a semiconductor fabrication process.

16. The method of claim 1, further comprising altering a parameter of a process tool in response to the electrical parameter using an in situ control technique.

17. A method for determining an electrical parameter of an insulating film, wherein a specimen comprises the insulating film formed on a substrate, the method comprising:

applying an electrical field across the insulating film, wherein leakage across the insulating film caused by the electrical field is negligible, and wherein the insulating film has a thickness such that a potential of the substrate is negligible;

measuring a surface voltage of the specimen; and determining the electrical parameter of the insulating film from the surface voltage, wherein said determining comprises determining a pure voltage across the insulating film from the surface voltage, and determining the electrical parameter of the insulating film from the pure voltage.

18. The method of claim 17, wherein the thickness is greater than about 400 Å.

19. The method of claim 17, wherein said measuring comprises measuring the surface voltage in accumulation, depletion, inversion, or a combination thereof.

* * * * *